United States Patent
Hoenigschmid et al.

(10) Patent No.: US 6,944,049 B2
(45) Date of Patent: Sep. 13, 2005

(54) MAGNETIC TUNNEL JUNCTION MEMORY CELL ARCHITECTURE

(75) Inventors: Heinz Hoenigschmid, Fishkill, NY (US); Dietmar Gogl, Fishkill, NY (US); John Kenneth DeBrosse, Colchester, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 124 days.

(21) Appl. No.: 10/422,100

(22) Filed: Apr. 24, 2003

(65) Prior Publication Data

US 2004/0085810 A1 May 6, 2004

Related U.S. Application Data

(60) Provisional application No. 60/422,225, filed on Oct. 30, 2002.

(51) Int. Cl.$^7$ ............................................. G11C 11/00
(52) U.S. Cl. ........................ 365/158; 365/171; 365/173
(58) Field of Search ................................ 365/158, 171, 365/172, 173

(56) References Cited

U.S. PATENT DOCUMENTS

| | | | | |
|---|---|---|---|---|
| 5,946,227 A | * | 8/1999 | Naji | ............................ 365/158 |
| 6,445,612 B1 | * | 9/2002 | Naji | ............................ 365/158 |
| 6,778,430 B2 | * | 8/2004 | Hidaka | ....................... 365/171 |
| 2002/0008989 A1 | | 1/2002 | Hoenigschmid | |
| 2002/0044482 A1 | | 4/2002 | Viehmann | |
| 2002/0057593 A1 | | 5/2002 | Hidaka | |

* cited by examiner

*Primary Examiner*—Connie C. Yoha
(74) *Attorney, Agent, or Firm*—Slater & Matsil, L.L.P.

(57) ABSTRACT

A memory device includes a magnetic tunnel junction memory cell having a magnetic tunnel junction structure and a read switch. In one example, the read switch is connected to a conductor that is used to write to the magnetic tunnel junction structure. In a further example, the read switch is a transistor electrically coupled to the magnetic tunnel junction structure by a deep via contact. In a further example, the memory device includes a plurality of magnetic tunnel junction memory cells and a plurality of conductors respectively associated with the cells for writing information to the associated magnetic tunnel junction structures. Each read switch is connected to the conductor associated with a magnetic tunnel junction cell other than the cell in which the read switch resides.

23 Claims, 3 Drawing Sheets

MAGNETIC TUNNEL JUNCTION MEMORY CELL ARCHITECTURE

This application claims the priority under 35 U.S.C. 119(e)(1) of copending U.S. Provisional Application No. 60/422,225, filed on Oct. 30, 2002 and incorporated herein by reference.

BACKGROUND OF THE INVENTION

1. Technical Field of the Invention

The present invention relates to the field of data storage and, more particularly, to a magnetic tunnel junction device memory cell architecture.

2. Description of Related Art

Magnetoresistive Random Access Memory (MRAM) is a high-speed, low-voltage, high-density, nonvolatile memory in which a bit of information is stored into a magnetic tunnel junction (MTJ) structure through the application of magnetic fields and is retrieved from the MTJ by measuring its resistance. MRAM's advantages over other technologies include the combination of fast reads and writes, nonvolatility, near-infinite cycling capability, full bit alterability, and a simple cell structure.

MTJs are sandwiches of two ferromagnetic (FM) layers separated by a thin insulating layer. Particularly useful MTJ structures are those in which one of the ferromagnetic layers is pinned by exchange bias to an antiferromagnetic layer. For MRAM applications an MTJ structure is designed to have two stable magnetic states, corresponding to parallel and antiparallel orientation of the FM layers in the MTJ device. More specifically, the MTJ material stack is generally composed of two magnetic layers separated by a thin dielectric barrier. A layer of antiferromagnetic material with strong exchange coupling, such as FeMn or IrMn, is placed in contact with the bottom magnetic layer, pinning it in one direction. This layer is separated from the next magnetic layer by a thin layer of Ru, creating a synthetic antiferromagnet. The strong exchange between the magnetic layers in the synthetic antiferromagnet structure fixes the magnetic polarization of the fixed layer in one direction and prevents the fixed layer from switching during write operations. A read circuit is used to obtain the state of the MTJ device by assessing the MTJ resistance given the fact that the MTJ device behaves as a variable resistor with two discrete resistance values dependent on the aforementioned relative orientation of the free magnet to the pinned magnet.

An integrated memory cell has an extensive fabrication process for manufacturing the MTJ and its associated circuits for writing to the MTJ and circuits for reading the MTJ. As with most integrated processes, lower cost can be accomplished by reducing the number of components, simplifying the fabrication process and/or reducing the memory cell surface area.

SUMMARY OF THE INVENTION

A memory device includes a magnetic tunnel junction memory cell having a magnetic tunnel junction structure and a read switch. In one embodiment, the read switch is connected to a conductor that is used to write to the magnetic tunnel junction structure. In a further embodiment, the read switch is a transistor electrically coupled to the magnetic tunnel junction structure by a deep via contact.

In a further embodiment, the memory device includes a plurality of magnetic tunnel junction memory cells and a plurality of conductors respectively associated with the cells for writing information to the associated magnetic tunnel junction structures. Each read switch is connected to the conductor associated with a magnetic tunnel junction cell other than the cell in which the read switch resides.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1:
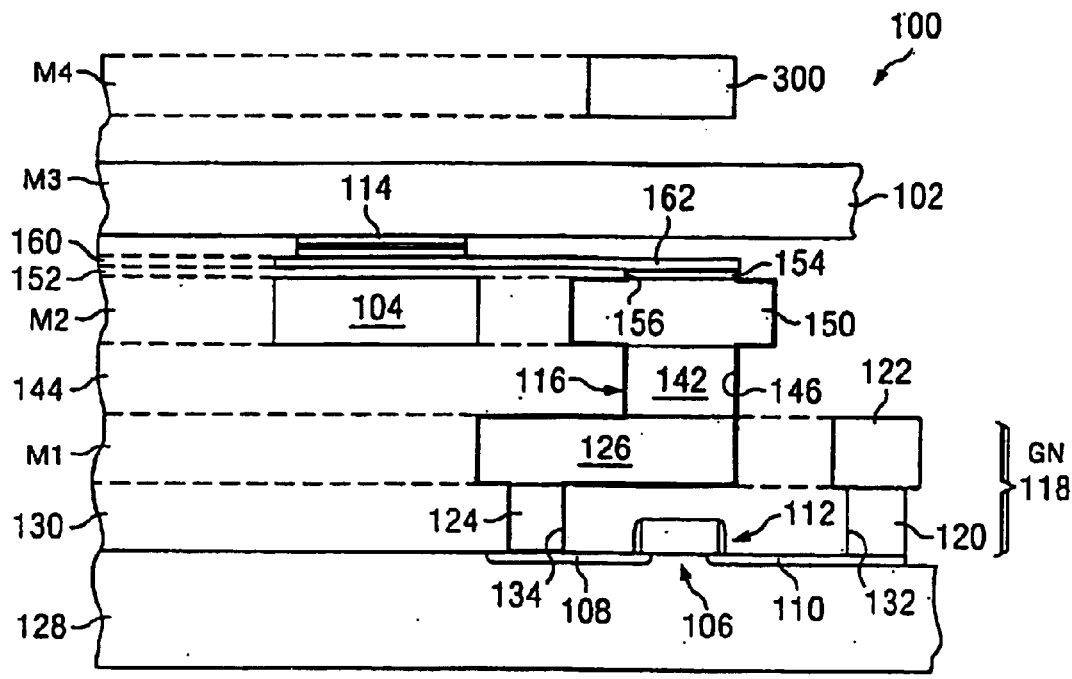
FIG. 1 illustrates a conventional MTJ MRAM cell.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

FIG. 1 illustrates a cross section of a conventional example of a MTJ MRAM cell 100. The illustration is parallel to and/or cuts through various elements, as described below. The elements of the cell 100 include a MTJ 114, a conductive layer 102 which operates as both a bit "write" line and a "read" line for the bit stored in the MTJ 114; a conductive layer 104 which operates as a word "write" line; and a FET 106, having a source 108, a drain 110 and a gate 112 which operates as a switch for the reading the stored bits. The write lines 102 and 104 are typically perpendicular to each other as viewed from above the cell 100 and reside in separated parallel planes.

The MTJ 114 is formed at the intersection of the write lines 102 and 104, as described elsewhere. One side of the MTJ 114 is electrically continuous with the line 102, and the other side is electrically rendered continuous with the source 108 of the FET 106 by an electrical path 116, described further below. Line 104 and the MTJ 114 are electrically discontinuous.

The drain 110 of the FET 106 is connected to ground 118.

Conventionally, the FET 106 is normally non-conducting so that no current can flow from the line 102, through the MTJ 114 the path 116 and the source 108 to ground. When appropriate currents are selectively momentarily applied to the lines 102 and 104, they create orthogonal magnetic fields in the MTJ 114. These fields selectively write or set the MTJ 114 in either its low resistive state ($R_{PARALLEL}$) or its high resistive state ($R_{ANTIPARALLEL}$). Subsequently, the state of the MTJ 114 maybe read by applying current from a current source to the line 102 and a signal to the gate 112 of the FET, the signal effecting conduction between the source 108 and the drain 110. The magnitude of the current flow—low or high—through the MTJ 114, the path 116 and the conducting FET 106 to ground 118 is sensed to determined if the MTJ 114 is in the high or low resistive state. The high resistive state results in a lower current through the elements 114, 116 and 106 than the low resistive state.

The MRAM may include large numbers of parallel bit lines (BL) 102 and orthogonal, mutually parallel word lines (WL) 104 with a MTJ 114 located at each wordline-bit line intersection.

Cell 100 is made by typical integrated circuit techniques, wherein regions and layers of various conductors, semiconductors and insulators are formed using lithographic, doping and other processes. For example, the ground 118 in FIG. 1 includes a post-like conductive metal contact 120 electrically continuous at one end with the diffusion region 110 (i.e. drain) of the FET and at the other end with a common conductive ground line 122 that extends into and out of the plane of the figure and is electrically continuous with similar contacts 120 of other cells 100 (not shown). Similarly, a portion of the path 116 includes a post-like electrical contact 124, connected at one end to the source 108 of the FET 106 and at its other end to a metal element 126 that serves as a portion of the path 116.

As shown, the contacts 120 and 124 are co-planar; also, the metal element 126 and the metal ground line 122 are co-planar. Indeed, the elements 120, 124 are formed at the same time and the metal elements 122, 126 are later formed at the same time from a deposited metal layer (M1). Specifically, after formation of the FET 106, in and on a silicon substrate 128 by conventional doping and deposition techniques, the FET 106 and surrounding areas of the substrate are covered with an electrically insulating layer 130. The layer 130 serves to protect the FET 106 during fabrication of the cell and later in use. The layer 130 ultimately has a depth equal to the height of the contacts 124, 120. This is typically achieved by depositing the layer 130 to a depth slightly greater than desired and then removing the excess by planarization techniques, such as chemical-mechanical polishing.

After the layer 130 is produced, it is selectively etched by known lithographic techniques or other similar techniques to produce vias or holes 132, 134 extending through the layer and exposing at the bottom thereof the source and drain 108 and 110. Metal is then deposited or filled into the vias 132, 134 so that the contacts 120, 124 so formed are respectively electrically continuous with the drain 110 and the source 108.

Next, the metal layer M1 is formed overlaying the layer 130 and the ends of the contacts 120, 124 with which ends the conductive layer M1 is in electrical continuity. The depth of the layer M1 ultimately assumes the desired thickness of the element 126 and the ground line 122, due to the application of planarization steps. Next, lithographic techniques are used to remove excess metal of the layer M1 leaving the element 126 and the ground line 122.

The path 116 includes a contact 142 that is electrically continuous with the element 126. The contact 142 is formed by first depositing an insulative layer 144 over the planarized top surfaces of the layer M1, the ground line 122 and the element 126, and then, by selective etching or other removal process, forming a via 146 therethrough. The via 146 is then filled with the material of the contact 142 and coplanarity of the top surface of the layer 144 and the contact 142 is achieved in any convenient manner.

Next, a second metallic layer (M2) is applied over the layer 144 and the top surface of the contact 142, followed by lithographic selective etching or other removal techniques for removal of selected portions of the layer M2 to produce the word write line 104 and a coplanar conductive member 150 in electrical continuity with the contact 142. Next an insulative layer 152 is formed on the planarized top surfaces of, and in the spacing between the line 104 and the member 150. Next, a contact 154 in electrical continuity with the top surface of the member 150 is formed in a via 156 extending through the layer 152.

On top of the planarized top surface of the insulative layer 152, a metal layer 160 is deposited, following which selective removal of the layer 160 leaves behind a metal member 162 which is electrically connected at one end to the top of the contact 154 and which has a "free" end spaced and electrically insulated from the top surface of the member 104. Similar techniques are used to fabricate the MTJ 114 on the top surface of and in electrical connection with the "free" end of the member 162. Again, known techniques are implemented to provide an additional metal layer (M3) from which the MTJ bit line (BL) 102 is formed, on top of and in electrical continuity with the MTJ 114.

Figure 1A:
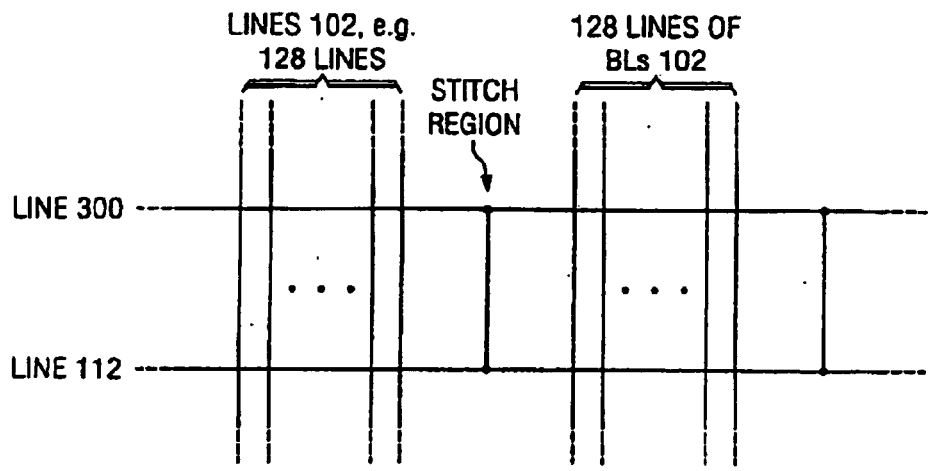
FIG. 1A shows a schematic representation of a part of the MTJ MRAM cell illustrated in FIG. 1.

Lastly, known techniques are implemented to provide a further metal layer (M4) from which metal line 300 is formed generally perpendicular to and electrically insulated from metal BL 102. Metal line 300 with its relatively lower resistance is used for lowering the resistance of the poly word line 112. The poly alone would provide a detrimentally long RC delay for the word line 112. Conventionally, metal line 300 has a sheet resistance of approximately 0.1 ohm/sq that is shunted to the poly word line 112 which has a sheet resistance of approximately 5 ohm/sq. As shown in FIG. 1A, the metal line 300 is shunted to the poly word line 112 every 128 bit lines, a typical scheme for a conventional MRAM arrangement. The shunt can be provided using, for example, a technique know from DRAM technology called stitching. The stitch enables the ohmic combination of metal line 300 and poly word line 112, which decreases the overall RC delay and therefore increases access time.

Note that metal layer M1 includes elements 122 and 126, M2 includes elements 104 and 150, M3 includes element 102, and M4 includes element 300. As can be seen, construction of a conventional MTJ MRAM includes several detailed layers and processes. A reduction in the number of layers and associated deposition operations, etching or other removal operations and/or other photolithographic operations would reduce fabrication costs and/or provide more memory per unit volume. An aspect of the present invention reduces the number of layers and, more specifically metal layers, thereby advantageously providing for decreased manufacturing cost and/or decreased cell volume.

Figure 2:
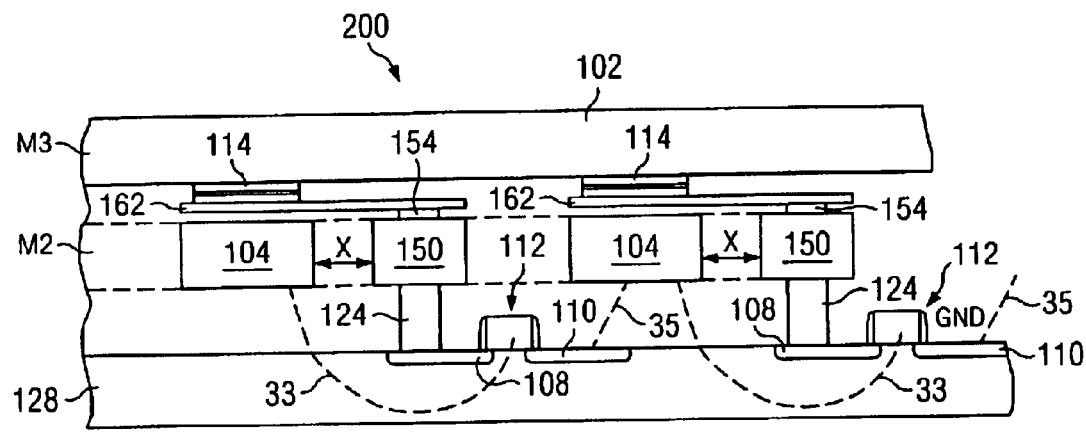
FIG. 2 illustrates a magnetic memory architecture in accordance with an exemplary embodiment of the present invention.

FIG. 2 illustrates a cross section of a MTJ memory device 200 according to exemplary embodiments of the present invention. The memory device 200 includes bit line 102 and word line 104 for operation of the MTJs 114 as above-described. Further, the memory device 200 can be made by the above-described conventional integrated circuit techniques. However, using the connection and activation scheme of the present invention, layers M1 and M4 (from FIG. 1) are eliminated from the present memory device 200. To maintain an advantageous low ohmic Read word line and low ohmic ground which is provided in the conventional MRAM cell 100 by metal layers (i.e. M4 and M1, respectively), line 104 of the present connection and activation scheme is made multifunctional. That is, in addition to line 104 being used to effectuate the magnetic field in the MTJ 114, line 104 is also used to reduce the high ohmic characteristic of the poly WL 112 and to provide for a low ohmic ground.

Figure 3:
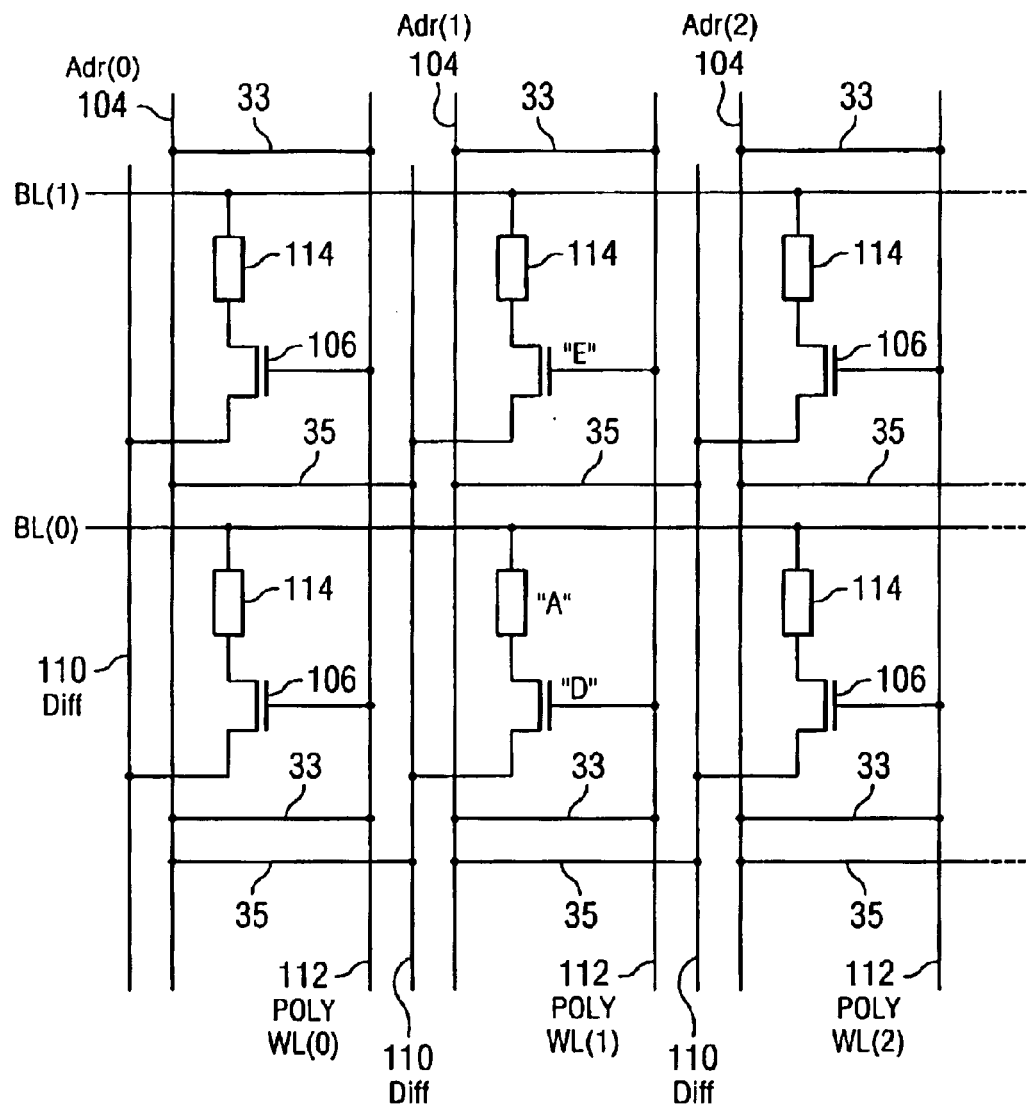
FIG. 3 shows a schematic representation of the magnetic memory architectures illustrated in FIGS. 2 and 2A.

To provide a low ohmic Read word line in accordance with the present connection and activation scheme, each cell's metal word line 104 is shunted to its poly WL 112. The shunt is shown as item 33 in FIGS. 2 and 3. FIG. 3 shows a schematic representation of the MTJ memory device 200 illustrated in FIG. 2. The shunt can be provided by a stitch process, for example, similar to the stitch of metal line 300 to the poly WL 112 described with regard to FIG. 1A. The advanced signal connection of line 104 (hereinafter referred to and identified in FIG. 3 as Adr(n) 104) combined with the corresponding activation scheme (described herein below) provides for elimination of M4 (FIG. 1).

To provide the low ohmic ground, Adr(n) 104 of each cell is also shunted to the diffusion ground 110 of the adjacent cell (as shown in FIG. 3 as item 35 and illustrated by the broken line in FIG. 2) in a stitch process. Thus, Adr(n) 104 in combination with the below-described activation scheme also performs the functionality of the metal ground line 122 of M1 (FIG. 1), which can therefore be eliminated. Thus, the contact 150 can be applied directly to the top surface of contact 124 which further eliminates contact 142, further reducing the overall height of the device 200.

The following describes an exemplary Read/Write activation scheme in accordance with the magnetic memory architecture shown in FIGS. 2 and 3. Firstly, to write to a particular MTJ cell 114, appropriate currents are selectively momentarily applied to the write lines BL(n) 102 and Adr(n) 104 associated with the MTJ cell 114. For example, to write cell "A" of FIG. 3, a write current, (of approximately 5 mA for example) is applied to Adr(1) and BL(0). Here, the voltage on Adr(1) is approximately 0.25V, the equivalent of 5 mA×50 ohms. Further, because the poly WL(1) is stitched 33 to Adr(1), the output of switches "D" and "E" must be held at low voltage (e.g. 0.25V) to prevent them from being switched ON during writing. With the diffusion region of each switch 106 being stitched to adjacent write lines Adr(n) 104, the outputs of switches "D" and "E" are held at low by applying the requisite 0.25 volts signal to all other Adr(n).

For reading cell "A", a current is applied to BL(0), and switch "D" is turned ON by applying an activation signal to the gate via Adr(1) and a ground reference to the switch output via the other Adr(n) for effectuating conduction through switch "D" which is sensed to determine the state of the MTJ of cell "A". More specifically, Adr(1) is pulled up to high (eg. approximately 1.8V) and all other Adr(n) are brought to low (eg. ground=0V) to provide the ground connection. Conventional circuitry can be included to sense the magnitude of the current flow for determining if the MTJ 114 is in the high or low resistive state. The high resistive state results in a lower current than the low resistive state.

The combination of the present connection and activation scheme provides the functionality of metal layers M1 and M4 and the write line of the conventional MTJ cell arrangement of FIG. 1 in a single multifunctional metal line.

Figure 2A:
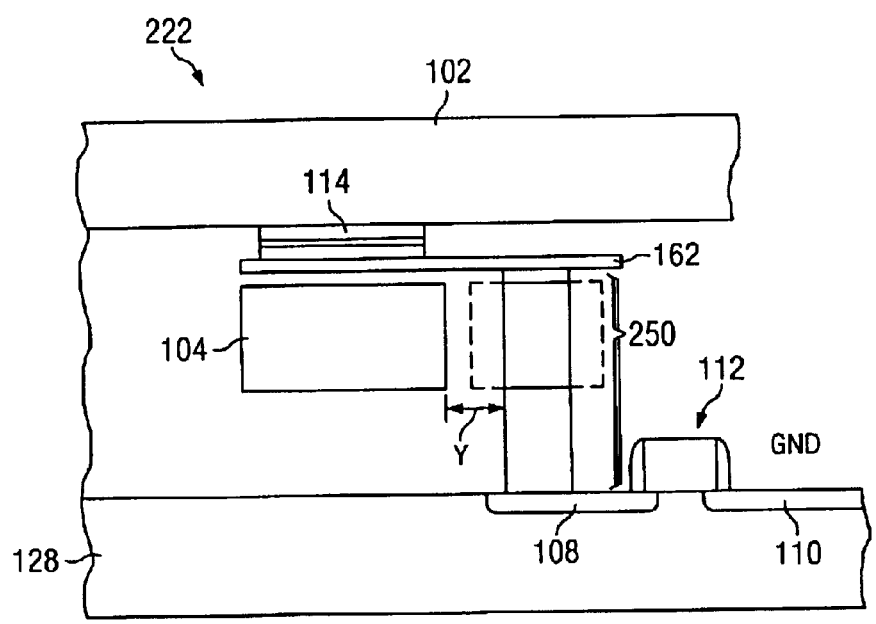
FIG. 2A illustrates a magnetic memory architecture in accordance with another embodiment of the present invention.

Referring now to FIG. 2A there is shown another embodiment of the present invention. In this embodiment, contacts 154, 150 and 124 (shown in FIG. 2) are combined into a single deep via contact 250. Conventional integrated circuit designs typically require a metal-to-metal distance between metal members, such as 104 and 150, in the range of approximately 0.24 μm (shown as "X" in FIG. 2). Using the deep via contact 250, distance X can be significantly reduced (by up to one third) which in turn greatly reduces the overall width of a multi-cell MTJ structure. Via contacts can conventionally be made more narrow than metal contacts. As illustrated in FIGS. 2 and 2A, the conventional via contacts 124, 154 and 250 are narrower (approximately 0.16 μm narrower) than a conventional metal member, such as member 150. Shown in FIG. 2A, use of the deep via contact permits a reduction from the X dimension of approximately 0.24 μm in FIG. 2 to the corresponding Y dimension of approximately 0.16 μm in FIG. 2A.

The deep via contact 250 is applied in electrical contact between the source 108 and member 162 and can be formed using well-known conventional techniques.

Although preferred embodiments of the apparatus and method of the present invention have been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A memory apparatus, comprising:

a plurality of magnetic tunnel junction cells, each said magnetic tunnel junction cell including a magnetic tunnel junction structure and a switch connected to said magnetic tunnel junction structure, said switch having a control input, said switch responsive to said control input for permitting information stored in said magnetic tunnel junction structure to be read out of said magnetic tunnel junction structure;

a plurality of conductors respectively associated with said magnetic tunnel junction cells, each said conductor coupled with the associated magnetic tunnel junction structure for use in writing information to the associated magnetic tunnel junction structure;

and each said switch connected to one of said conductors other than the conductor associated with the magnetic tunnel junction cell in which said switch is included.

2. The apparatus of claim 1, wherein each said switch has first and second nodes, each said switch responsive to said control input thereof for permitting current flow between said first and second nodes thereof, each said first node connected to the corresponding magnetic tunnel junction structure, each said second node connected to the associated said one of said conductors.

3. The apparatus of claim 2, including a plurality of groups of said magnetic tunnel junction cells, said plurality of conductors respectively associated with said groups, each said conductor coupled with said magnetic tunnel junction structures of the associated group for use in writing information to said magnetic tunnel junction structures of the associated group, and each said second node connected to one of said conductors other than the conductor associated with the group in which said second node is included.

4. The apparatus of claim 3, wherein each of said second nodes of a first said group are connected to the conductor associated with a second said group.

5. The apparatus of claim 4, wherein each of said second nodes of a third said group are connected to the conductor associated with said first group.

6. The apparatus of claim 3, including a plurality of shunts respectively associated with said second nodes, each said shunt extending between and electrically connecting the associated second node and the conductor to which the associated second node is connected.

7. The apparatus of claim 3, wherein said second nodes within each said group are connected together.

8. The apparatus of claim 7, wherein said second nodes within each said group are grounded.

9. The apparatus of claim 2, wherein each of said switches is a field effect transistor having a gate which defines said control input thereof, having a source which defines said first node thereof, and having a drain which defines said second node thereof.

10. The apparatus of claim 1, wherein said conductors are wordlines.

11. The apparatus of claim 1, wherein said control input of each said switch is connected to the conductor associated with the magnetic tunnel junction cell.

12. The apparatus of claim 11, wherein each said switch has a control input connected to the conductor associated with the magnetic tunnel junction cell in which said switch is included, and wherein each said switch has a node other than said control input connected to the associated said one of said conductors.

13. The apparatus of claim 9, wherein said conductor is a wordline.

14. The apparatus of claim 9, wherein said gate is a polysilicon gate.

15. The apparatus of claims 11, including a shunt extending between and electrically connecting said control input and said conductor.

16. The apparatus of claim 15, wherein said shunt is a stitched shunt.

17. The apparatus of claim 11, wherein said plurality of magnetic tunnel junction cells comprise a plurality of groups of said magnetic tunnel junction cells, and wherein said plurality of conductors are respectively associated with said groups, each said conductor coupled with said magnetic tunnel junction structures of the associated group for use in writing information to said magnetic tunnel junction structures of the associated group, each said control input of each said group connected to the conductor associated with said group.

18. The apparatus of claim 17, wherein said control inputs within each said group are connected together.

19. The apparatus of claim 18, wherein said switches are field effect transistors and said control inputs are polysilicon gates of said field effect transistors.

20. The apparatus of claim 17, including a plurality of shunts respectively connected to said control inputs, each said shunt extending between and electrically connecting the associated control input and the conductor to which the associated control input is connected.

21. A memory apparatus, comprising:
a substrate; a transistor formed on said substrate; a layer of electrically insulating material overlying said transistor; a conductor overlying said layer of electrically insulating material;
a magnetic tunnel junction structure electrically connected to said conductor, said magnetic tunnel junction structure formed on a surface of said conductor opposite said layer of electrically insulating material; and
a via contact extending through said layer of electrically insulating material and electrically connecting said conductor to said transistor.

22. The apparatus of claim 21, wherein said transistor is a field effect transistor and said via contact is connected to a source of said field effect transistor.

23. The apparatus of claim 1 wherein each of said plurality of conductors provide the same function to an associated magnetic tunnel junction cell.

* * * * *